United States Patent [19]
Zambrano

[11] Patent Number: 5,652,455
[45] Date of Patent: Jul. 29, 1997

[54] INTEGRATED STRUCTURE CIRCUIT FOR THE PROTECTION OF POWER DEVICES AGAINST OVERVOLTAGE

[75] Inventor: Raffaele Zambrano, San Giovanni La Punta, Italy

[73] Assignee: Consorzio per La Ricerca Sulla Microelettronica Nel Mezzogiorno, Catania, Israel

[21] Appl. No.: 241,010

[22] Filed: May 11, 1994

[30] Foreign Application Priority Data

May 13, 1993 [EP] European Pat. Off. .............. 93830200

[51] Int. Cl.$^6$ ................................... H01L 23/62
[52] U.S. Cl. ................ 257/360; 257/355; 257/361; 257/362; 257/363
[58] Field of Search .................. 257/360, 361, 257/362, 363, 355

[56] References Cited

U.S. PATENT DOCUMENTS

| | | |
|---|---|---|
| 4,893,158 | 1/1990 | Mihara et al. ........................... 257/360 |
| 5,162,966 | 11/1992 | Fujihira . | |
| 5,401,996 | 3/1995 | Kelly ........................................ 257/360 |

FOREIGN PATENT DOCUMENTS

| | | |
|---|---|---|
| 0327475 | 8/1989 | European Pat. Off. . |
| 2260869 | 9/1975 | France . |
| 3142591 | 10/1982 | Germany . |

*Primary Examiner*—Mahshid D. Saadat
*Assistant Examiner*—Valencia Martin Wallace
*Attorney, Agent, or Firm*—David V. Carlson; Bryan A. Santarelli; Seed and Berry LLP

[57] ABSTRACT

An integrated structure protection circuit suitable for protecting a power device against overvoltages comprises a plurality of serially connected junction diodes, each having a first electrode, represented by a highly doped region of a first conductivity type, and a second electrode represented by a medium doped or low doped region of a second conductivity type. A first diode of said plurality has its first electrode connected to a gate layer of said power device and its second electrode connected to the second electrode of at least one second diode of said plurality, and said at least one second diode has its first electrode connected to a drain region of the power device. The doping level of the second electrode of the diodes of said plurality is suitable to achieve sufficiently high breakdown voltage values.

22 Claims, 5 Drawing Sheets

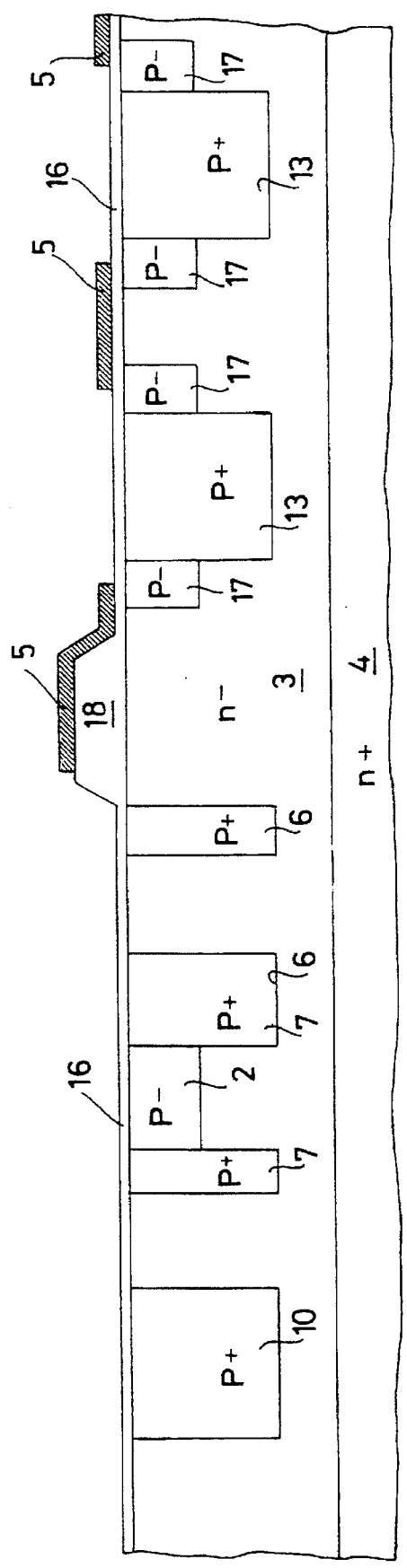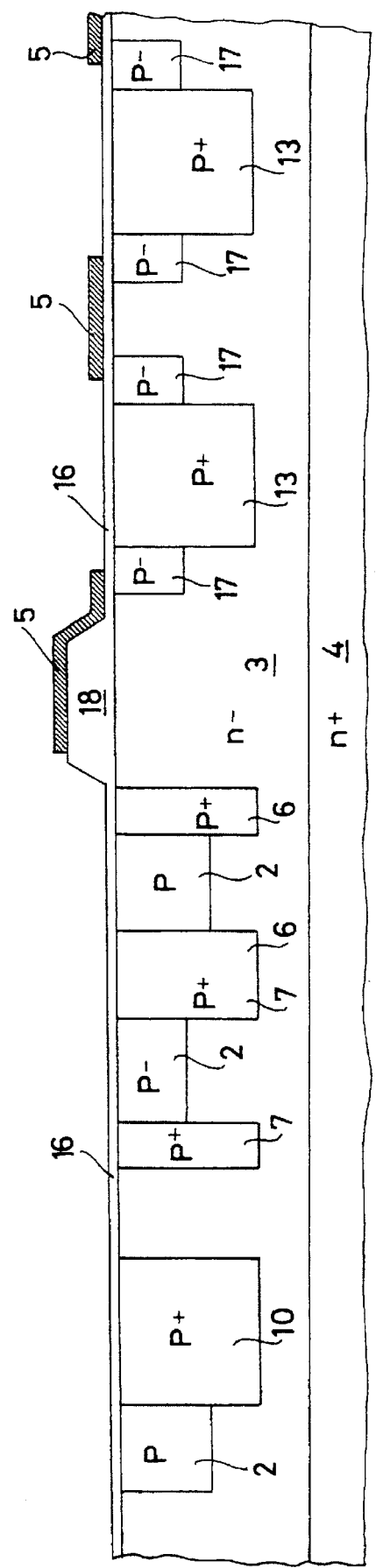

INTEGRATED STRUCTURE CIRCUIT FOR THE PROTECTION OF POWER DEVICES AGAINST OVERVOLTAGE

TECHNICAL FIELD

The present invention relates to an integrated structure circuit for the protection of power devices, particularly MOSFETs and IGBTs (Insulated Gate Bipolar Transistors), against overvoltages.

BACKGROUND OF THE INVENTION

Power MOSFETs and IGBTs are frequently employed to drive an inductive load, such as an ignition coil. Due to this type of load, overvoltages appear across the device when it is switched off; said overvoltages can be very high, stressing the device as it drains the nominal current for a short time interval after it has been switched off. Moreover, high overvoltages can lead to the breakdown of the device, and to its permanent damage if it is not able to dissipate the energy stored in the inductive load.

To prevent such problems, power devices are generally protected with an external clamping diode having a breakdown voltage lower than that of the device to be protected. Stray inductances and operating time of the protection device, however, limit the effectiveness of such protections.

In order to overcome such limits, the manufacturers of power MOS devices have developed integrated structure protection circuits, called "active clamps", comprising a resistive element, connected in series between an external gate electrode and the gate of the power device, and a clamping element between the gate and the drain of power device. When the power device is switched off, overvoltages give rise to a voltage drop across the terminals of the clamping element; if said voltage drop exceeds the breakdown voltage of the clamping element, current will flow through it and the resistive element, between the drain of the power device and the gate electrode. As soon as the voltage drop across the resistive element exceeds the turn-on voltage of the power device (which, in the case of the power MOSFETs is represented by the threshold voltage), this will turn-on again and start draining current; thus the current that must be sustained by the active clamp is very low. Overvoltages across the power device will be clamped to a maximum value (Vclamp) represented by the sum of the breakdown voltage of the clamping element and the turn-on voltage necessary to sustain the current flowing through the power device itself.

It should be understood that a simple diode, whose anode and cathode are respectively connected to the gate and to the drain of a n⁻ channel power MOSFET, is not suitable. This is because when the power MOSFET is in the on state, the diode would be forward biased, and the current flowing from the gate to the drain through said diode would introduce an offset equal to the forward voltage of the diode in the output characteristics of the device.

A possible clamping element is represented by a pair of diodes back-connected by their anodes, while their cathodes are respectively connected to the gate and the drain of the power MOSFET.

It is furthermore possible to serially connect a plurality of such diodes, provided that the gate of the power MOSFET is not connected to any of their anodes: in this way it is possible to reach the desired value for Vclamp.

In the prior art mentioned in U.S. Pat. No. 5,162,966, an active clamp for a power MOSFET is described wherein the clamping element utilizes a chain of $n^+/p^+$ junction diodes. The anode of each diode is made up of a $p^+$ region extending from the semiconductor surface into an n epitaxial layer representing the drain of the power MOSFET, while the cathode is an $n^+$ diffusion into said $p^+$ region.

Each diode of the chain has associated with it a parasitic diode whose anode and cathode are respectively represented by the $p^+$ region and by the n epitaxial layer. It follows that the gate of the power MOSFET shall not be connected to any diode anode, in order to prevent one of said parasitic diodes from affecting the output characteristics of the device in the on state, because of the electrical connection between the gate and the drain. To this purpose, in the described structure the first diode of the chain is connected to the gate of the n-channel power MOSFET by its cathode, and has its anode connected to that of the second diode of the chain. All of the other diodes have their cathodes connected to the anode of the following diode, while the cathode of the last diode is connected to the drain of the power MOSFET.

A problem arising from the use of $p^+/n^+$ junction diodes is represented by their low breakdown voltage, typically in the range of a few volts. When the power MOSFET is in the on state, the first diode of the chain is reverse biased; if the voltage across if exceeds its breakdown, current will flow through it and its associated parasitic diode, thus between the gate and the drain of the power MOSFET, affecting the output characteristics of the power device.

Another problem associated with the low breakdown voltage of the $p^+/n^+$ diodes of the chain is the necessity of a series connection of a large number of the diodes in order to operate with a high Vclamp value; this causes complications on the layout and increases the area occupied by the protection circuit.

A further problem is represented by the impossibility to obtain active clamps with a small thermal drift coefficient, since this parameter is given by the sum of the thermal coefficients of the breakdown voltage of each diode of the chain.

Finally, it is impossible to obtain active clamps with Vclamp values different from the sum of the threshold voltage of the power MOSFET plus an integer multiple of the breakdown voltage of a $p^+/n^+$ diode.

SUMMARY OF THE INVENTION

In view of the state of the art described, the object of the present invention is to provide an integrated structure circuit for the protection of power devices, particularly MOSFETs and IGBTs, against overvoltages, which is not affected by the above mentioned problems.

According to the present invention, such object is attained by means of an integrated structure protection circuit comprising a plurality of serially connected junction diodes obtained in a semiconductor material of a first conductivity type in which the power device is also obtained, each junction diode of said plurality comprising a first electrode made of a highly doped region of the first conductivity type extending from a top surface of the semiconductor material within a doped region of a second conductivity type which represents a second electrode of said junction diode and extends into the semiconductor material from said top surface, a first diode of said plurality of diodes having its first electrode connected to a gate layer of said power device and its second electrode connected to the second electrode of at least one second diode of the plurality, the first electrode of said at least one second diode being connected to a drain region of the power device, characterized in that said doped regions of a second conductivity type are either low doped or medium doped semiconductor regions suitable to obtain junction diodes with sufficiently high breakdown voltage values, i.e., at least higher than 5 volts.

According to an embodiment of the present invention, the first electrode of said at least one second diode is coincident with the drain region of the power device. This avoids the necessity of providing a dedicated connection between the drain region of the power device and the first electrode of the second diode.

According to a preferred embodiment of the present invention, said plurality of serially connected junction diodes comprises a series of said second diodes, interposed between the second electrode of said first diode and the drain region of the power device.

According to a further preferred embodiment of the present invention, such plurality of serially connected junction diodes further comprises at least one intermediate diode having a first electrode made of a highly doped region of said first conductivity type which extends from said top surface of the semiconductor material within a highly doped region of said second conductivity type representing a second electrode of the intermediate diode, said intermediate diode being interposed between two said second diodes in such a way as to have its first electrode connected to the first electrode of a preceding second diode and its second electrode connected to the second electrode of a following second diode.

When an overvoltage occurs, each intermediate diode is forward biased, as well as the first diode of said plurality, while all the second diodes of the plurality are reverse biased; current will start flowing when they avalanche, and the intermediate diodes are turned on.

Thanks to the structure according to the present invention, it is possible to obtain active clamps in which the clamping element has a high Vclamp value even with short chains of serially connected diodes, since each of them has a higher breakdown voltage compared to the $n^+/p^+$ diodes employed in the known-art structures. Furthermore, thanks to the structure according to the preferred embodiment of the present invention, it is possible to reduce the thermal drift of the Vclamp value; the positive thermal coefficient of the diodes' breakdown is in fact compensated by the negative thermal coefficient of the forward voltage ("Vf") of the forward biased intermediate diodes. Moreover, since the Vclamp value is given by the sum of the threshold voltage of the power device, the breakdown voltages of the reverse biased second diodes of said plurality, and the forward voltage of the forward biased intermediate diodes, it can be varied almost continuously in steps corresponding to Vf (generally lower than 1 V) by providing the desired number of such forward biased intermediate diodes.

BRIEF DESCRIPTION OF THE DRAWINGS

The present invention will now be described in greater detail in non-limiting way with reference to the annexed drawings.

FIGS. 2 through 7 show cross-sectional views representing intermediate steps of the fabrication process of a power device provided with said integrated structure protection circuit.

DETAILED DESCRIPTION OF THE INVENTION

Figure 1:
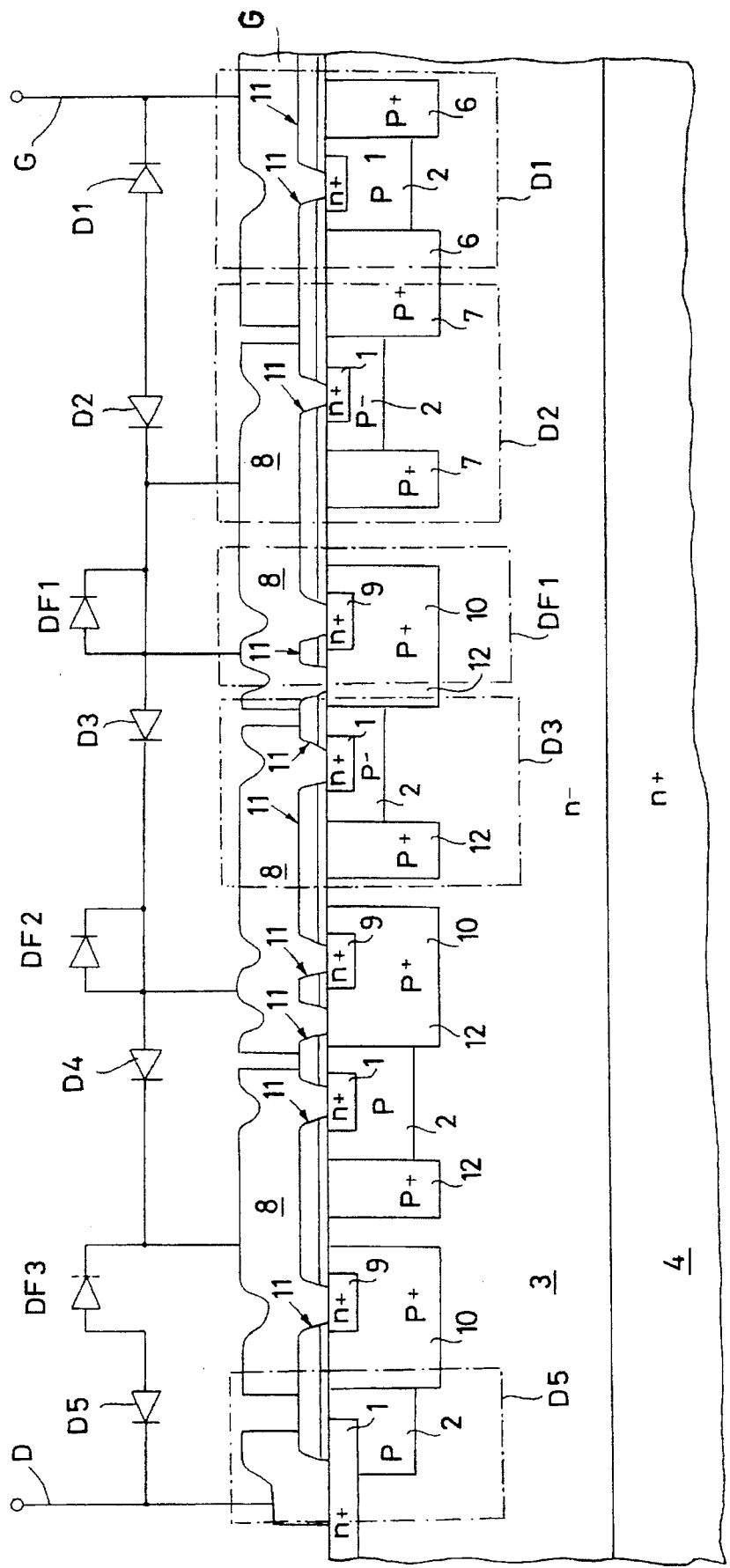
FIG. 1 is a cross-sectional view of an integrated structure protection circuit according to the present invention, with a corresponding equivalent electrical diagram superimposed thereon.

With reference to FIG. 1, an integrated structure protection circuit according to the present invention comprises a plurality of junction diodes, for example five diodes D1–D5 connected in series. Each diode D1–D5 comprises an $n^+$ type cathode region 1, extending from a top surface of a semiconductor substrate 4 within a respective p type or $p^-$ type anode region 2 which in turn extends into an $n^-$ type epitaxial layer 3 grown on said semiconductor substrate 4, for example of the $n^+$ type; diodes D1, D4 and D5 are thus made up of $p/n^+$ junctions, while diodes D2 and D3 are made up of $p^-/n^+$ junctions.

The cathode region 1 of diode D1 is connected, by means of a superimposed conductive gate electrode layer G, to a polysilicon gate layer 5 of a power device (FIG. 7), while its anode region 2 is surrounded by an annular $p^+$ type deep body region 6; one side of the latter is merged with a second annular $p^+$ type deep body region 7 which surrounds the p type anode region 2 of diode D2; the anode regions 2 of diodes D1 and D2 are thus in electrical contact.

The cathode region 1 of each of diodes D2–D4 is connected via separated strips of a superimposed conductive layer 8 (insulated from the top surface by an interposed insulating layer 11) to an $n^+$ type cathode region 9 of a forward biased serially connected intermediate diode belonging to a plurality of intermediate diodes, for example three diodes DF1–DF3; said $n^+$ type cathode region 9 extends from the top surface within a respective $p^+$ type deep body region 10 representing an anode region of said intermediate diode DF1–DF3. Each of such intermediate diodes DF1–DF3 can be short-circuited by contacting its respective anode region 10 with the strip of conductive layer 8 which also contacts its cathode region 9 (as in the case of diodes DF1 and DF2 in FIG. 1): this only requires to modify a single mask in the fabrication process, as will be explained later on.

One side of the anode region 10 of each of the intermediate diodes DF1 and DF2 is merged with an annular $p^+$ type deep body region 12 surrounding the p type or $p^-$ type anode region 2 of the following diode D3 and D4; this ensures the electrical contact between the anode regions 10 of intermediate diodes DF1 and DF2 and the anode regions of diodes D3 and D4 respectively.

The anode region 10 of the intermediate diode DF3 is in contact with the anode region 2 of the diode D5, whose cathode region 1 extends laterally from inside the anode region 2 into the epitaxial layer 3, and is consequently in contact with a drain region of the power MOS device. As appears from the drawings, the cathode region 9 and the anode region 10 of intermediate diode DF3 are not short circuited, and said diode is effectively forward connected in series between diodes D4 and D5.

A fabrication process suitable to obtain a power device M, for example of a MOSFET-type, provided with the integrated structure protection circuit of the present invention starts with the growth of the low-doped epitaxial layer 3, for example of the n type, over the highly-doped semiconductor substrate 4, in this example of the $n^+$ type.

Figure 2:
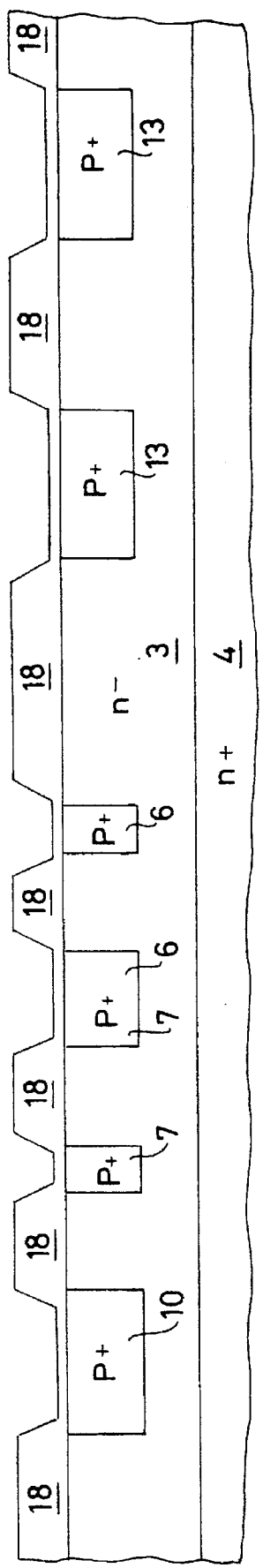

After a field oxide layer 18 has been grown, a selective implantation and subsequent diffusion of a high concentration of a p type dopant is performed, in order to form the $p^+$ type deep body regions 6, 7 and 10 of the protection circuit and a plurality of $p^+$ deep body regions 13 for the elementary cells 14 of the power MOSFET (FIG. 2).

Figure 3:
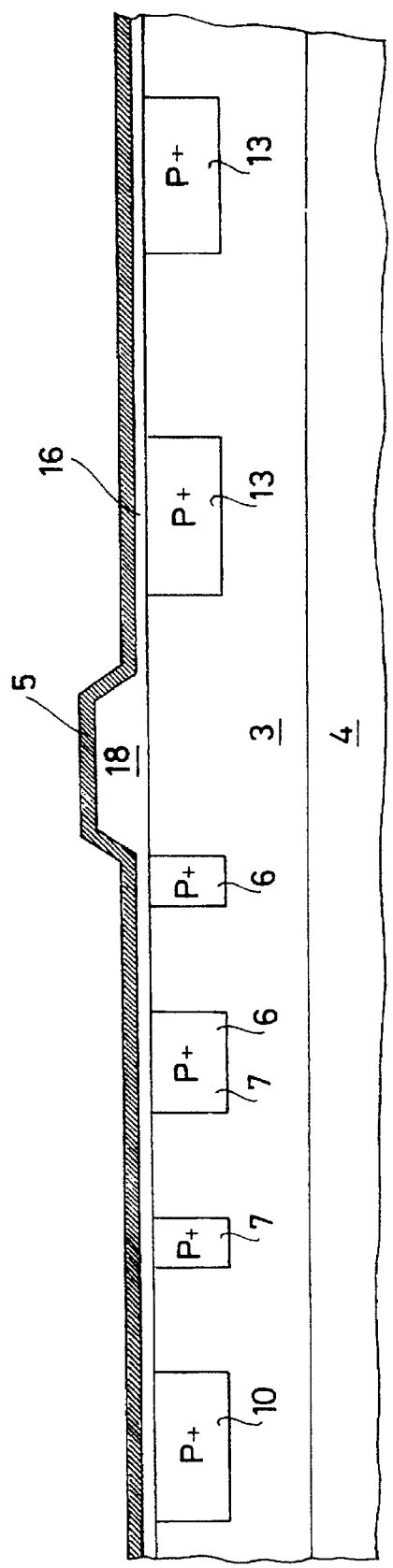

After a masking step, active areas are defined on the surface of the epitaxial layer 3; a thin gate oxide layer 16 is then grown over said active areas, and a polysilicon gate layer 5 is subsequently deposited over said gate oxide layer 16, and doped to achieve low resistivity (FIG. 3).

The polysilicon gate layer 5 is then selectively etched outside said gate regions, and after a masking step, a low concentration of p type dopant is implanted and diffused under said gate regions to form p⁻ type channel regions 17 of each cell 14 of the power MOSFET, as well as the p⁻ type anode region 2 of the diode D2 of the protection circuit (FIG. 4).

If, as in the present example, some diodes of the protection circuit shall have medium doped p type anode regions 2, a masked implant and subsequent diffusion of a medium concentration of p type dopant is performed (FIG. 5). In such a way the effects of a parasitic vertical npn transistor (whose emitter, base and collector are respectively represented by the cathode region 1 and the anode region 2 of the diodes D1–D5 and the drain of the power MOSFET) are reduced. The breakdown voltage of such diodes is lower than that of the n⁺/p⁻ diodes, but higher than that of the n⁺/p⁺ diodes; this allows an additional degree of freedom in the active clamp design. This implantation can as well be performed into the p⁺ type deep body region 13 of the cells 14, to increase the device's ruggedness. It is to be noted that this implementation and diffusion step can be performed simultaneously to the implantation and diffusion of the low concentration of p type dopant described above, or even precede it; a further possibility is to perform this implantation and diffusion step before the definition of the gate regions. In any case, the condition must be respected that the dopant concentration is intermediate between those of the p⁺ type regions and of the p⁻ type regions.

Figure 6:
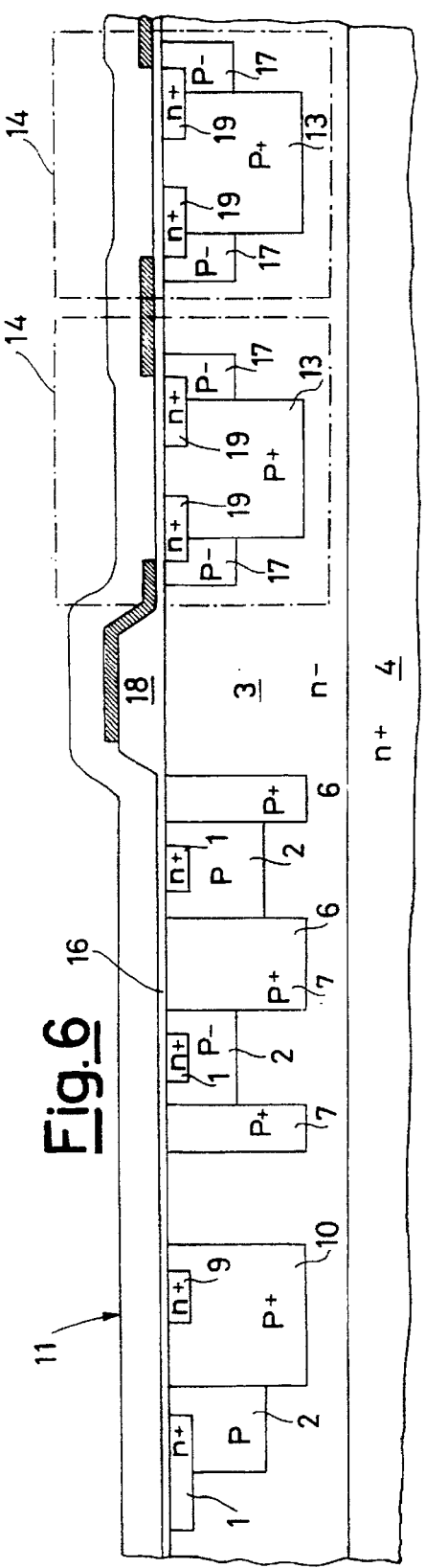

The following step is the selective implant and diffusion of a high concentration of n type dopant at the sides of said gate regions, to form source regions 19 of the power MOSFET M, and inside the p⁺, p and p⁻ type regions 10 and 2 to form the cathode regions 1 and 9 of the diodes of the protection circuit. An insulating layer 11 is then deposited over the polysilicon gate layer 5 (FIG. 6).

Figure 7:
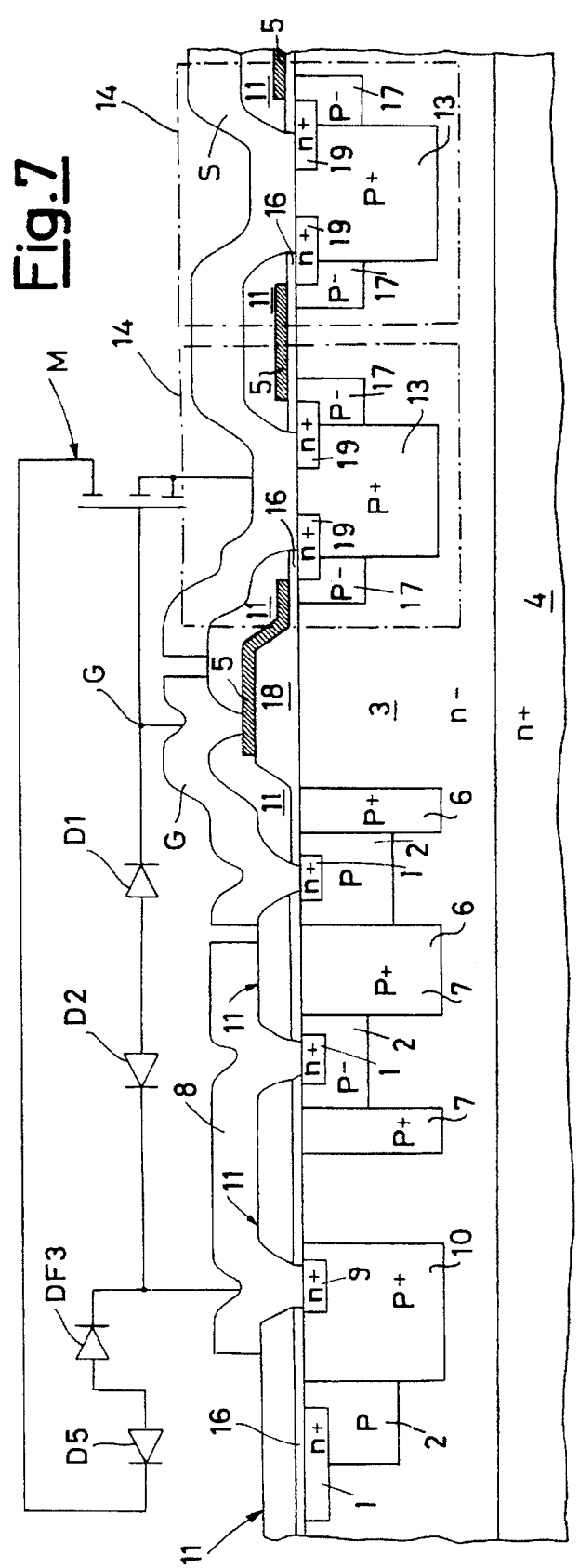

The final steps of the process involve the definition of contact areas, the deposition of a conductive layer needed to ensure the electrical interconnections among the various components, and the deposition of a passivating layer (FIG. 7). By simply modifying the mask defining contact areas it is possible to selectively short-circuit those forward biased intermediate diodes, such as DF1 and DF2 in FIG. 1, which are not deemed necessary in the particular application.

The metallization of the bottom surface of the substrate 4 is also provided, in order to form a contact to the drain of the power MOSFET.

The above process, apart from the step of implantation of the medium concentration of p type dopant, is similar to a known process for the fabrication of a power MOS device. Such step is however optional, in that the diodes D1–D5 could all be made of p⁻/n⁺ junctions.

As it is clear to anyone skilled in the art, the structure according to the invention can also be used to protect Insulated Gate Bipolar Transistors (IGBTs), simply by starting the process flow with a p⁻ type, heavily doped substrate, on which an n− type epilayer similar to the epilayer 3 described before has been grown.

Also, the invention applies to p− channel devices; in this case it is necessary to substitute p− type regions for n− type regions and vice versa.

Figure 8:
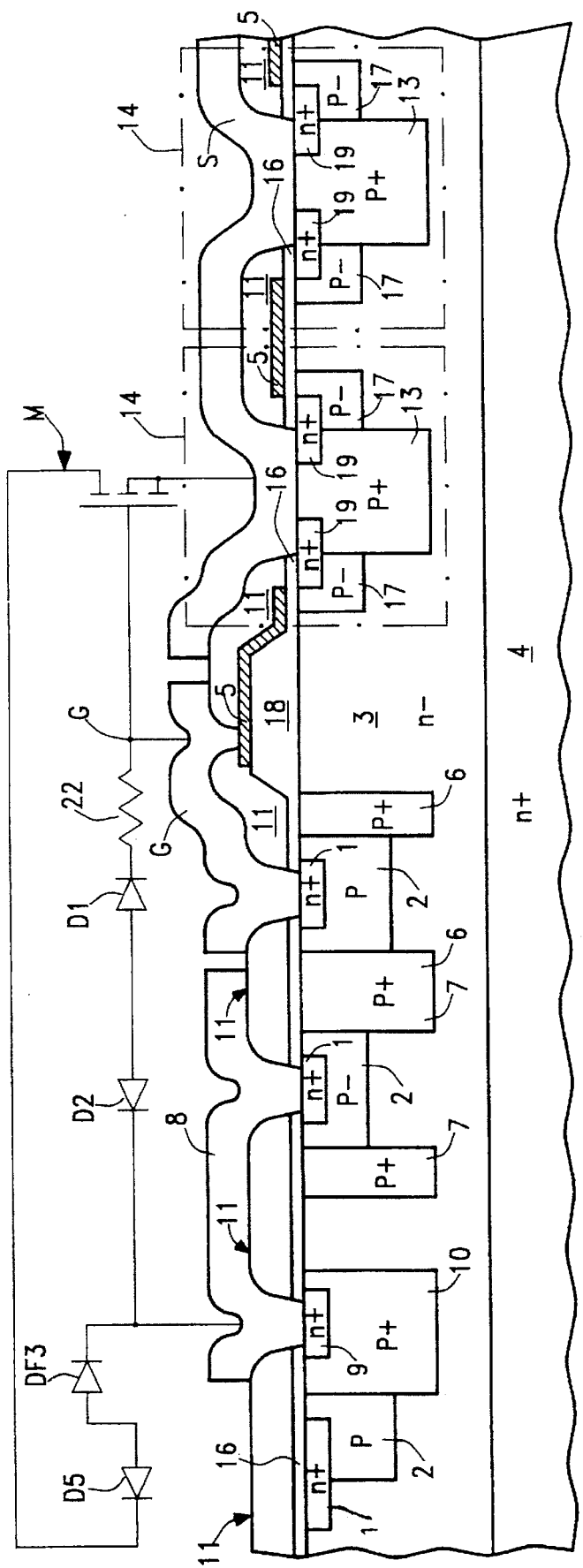
FIG. 8 is a cross-sectional view of an alternative integrated structure protection circuit according to the present invention.

In an alternative embodiment under the present invention shown in FIG. 8, a resistor (for example made of a portion of the polysilicon layer 5) between the gate of the power MOSFET and the cathode region 1 of the first diode, in order to increase the series resistance of the active clamp structure without increasing the series resistance between the gate region and the gate electrode of the power MOSFET.

Although specific embodiments of the invention have been described for purposes of illustration, various modifications may be made without departing from the spirit and scope of the invention, as will be recognized by those skilled in the art based on the description provided herein. Accordingly, the invention is not limited by the disclosure, but instead its scope is to be determined entirely by reference to the following claims.

I claim:

1. An integrated protection circuit for protecting an integrated power MOS device comprising:

a semiconductor substrate having a surface region, a portion of said semiconductor substrate forming a drain region of said power MOS device;

source and body regions of said power MOS device formed in said drain region, said power MOS device having associated therewith a breakdown voltage between said source and drain regions;

a gate region of said power MOS device formed over a portion of said body region;

a plurality of junction diodes serially coupled between said gate and drain regions, each of said diodes having
  an anode region of a first conductivity type formed in said surface region of said semiconductor substrate and having a low to medium doping selected to provide for said plurality of serially coupled diodes a total breakdown voltage that is lower than said breakdown voltage between said drain and source regions of said power MOS device, and
  a cathode region of a second conductivity type formed in a surface portion of said anode region and having a high doping;

a first of said plurality of diodes having its cathode region coupled to said gate region of said power MOS device; and a second of said diodes having its cathode region coupled to said drain region of said power MOS device and having its anode region coupled to the anode region of said first of said diodes.

2. The integrated protection device of claim 1, further comprising:

an intermediate diode having an anode region of said first conductivity type formed in said surface region of said semiconductor substrate and having a high doping, and having a cathode region of said second conductivity type formed in a surface portion of said anode region of said intermediate diode, said cathode region of said intermediate diode having a high doping;

a third of said plurality of diodes coupled between said first and second of said plurality of diodes, said third diode having its anode region coupled to said anode region of said first diode; and said intermediate diode coupled between said second and third of said plurality of diodes, said anode region of said intermediate diode coupled to said anode region of said second diode, and said cathode region of said intermediate diode coupled to said cathode region of said third diode.

3. The integrated protection device of claim 1, further comprising a plurality of perimeter regions of said first conductivity that are formed in said surface region of said semiconductor substrate and that have a high doping, each of said plurality of perimeter regions formed around the perimeter era corresponding one of said plurality of junction diodes.

4. The integrated protection device of claim 1, further comprising a resistor that is formed on said semiconductor substrate and that is serially coupled between said gate region of said power MOS device and said cathode region of said first diode.

5. An integrated protection circuit for a power device having a gate region, drain region, body region and source region, the protection circuit comprising:

a semiconductor material in which said body and said source regions of said power device are formed, said semiconductor material having a first conductivity and surface, a portion of said semiconductor material forming said drain region;

a plurality of serially coupled junction diodes that are formed in said semiconductor material, each of said diodes including, a first low to medium doped region formed in said semiconductor material and having a second conductivity, said low to medium doped region extending into said semiconductor material from said surface of said semiconductor material, and a second highly doped region formed within a portion of said low to medium doped region and having said first conductivity, said highly doped region extending into said low to medium doped region from said surface of said semiconductor material;

a first one of said diodes having its second region coupled to said gate region of said power device; and a second one of said diodes having its first region coupled to the first region of said first diode and having its second region coupled to said drain region of said power device.

6. An integrated structure protection circuit according to claim 5, characterized in that said second region of said second diode of said plurality of diodes is merged with said drain region of said power device.

7. An integrated structure protection circuit according to claim 5, characterized in that said plurality of serially coupled junction diodes comprises a third diode that is serially coupled between said first diode and said second diode, said third diode having its first region coupled to said first region of said first diode and having its second region coupled to said first region of said second diode.

8. An integrated structure protection circuit according to claim 5, characterized in that it comprises a resistor interposed between said gate electrode of said power device and said second region of said first diode.

9. An integrated structure protection circuit according to claim 8, characterized in that said resistor is made from a portion of said gate electrode.

10. An integrated structure protection circuit according to claim 5, characterized in that said regions having said first conductivity are semiconductor regions doped with donor impurities, while said regions having said second conductivity are semiconductor regions doped with acceptor impurities.

11. An integrated structure protection circuit according to claim 10, characterized in that for each of said plurality of diodes, said second highly doped region having said first conductivity is an $n^+$ type semiconductor region.

12. An integrated structure protection circuit according to claim 7, characterized in that such plurality of serially connected junction diodes further comprises:

an intermediate diode having a third highly doped region formed in said semiconductor material and having said second conductivity, said third highly doped region extending into said semiconductor material from said surface of said semiconductor material, said intermediate diode having a fourth highly doped region formed within a portion of said third highly doped region and having said first conductivity, said fourth highly doped region extending into said third highly doped region from said surface of said semiconductor material; and said intermediate diode serially coupled between said second and third diodes, said third region of said intermediate diode coupled to said first region of said second diode, said fourth region of said intermediate diode coupled to said second region of said third diode.

13. An integrated structure protection circuit according to claim 12, characterized in that for said intermediate diode said third highly doped region having said second conductivity is a $p^+$ type semiconductor region.

14. An integrated structure protection circuit according to claim 10, characterized in that for each of said plurality of diodes, said first low to medium doped region is respectively a p type or $p^-$ type semiconductor region.

15. An integrated structure protection circuit according to claim 14, characterized in that for each of said plurality of diodes, said first low to medium doped region has a perimeter, said first low to medium doped region surrounded along said perimeter by a heavily doped region of the same conductivity type as said low to medium doped region.

16. An integrated structure protection circuit according to claim 15, characterized in that said regions having said first conductivity are semiconductor regions doped with acceptor impurities, while said regions having said second conductivity are semiconductor regions doped with donor impurities.

17. An integrated structure protection circuit according to claim 16, characterized in that for each of said plurality of diodes, said second highly doped region having said first conductivity is a $p^+$ type semiconductor region.

18. An integrated structure protection circuit according to claim 12, characterized in that for said intermediate diode, said third highly doped region having said second conductivity is an $n^+$ type semiconductor region.

19. An integrated structure protection circuit according to claim 16, characterized in that for each of said plurality of diodes, said first low to medium doped region is respectively an n type or an $n^-$ type semiconductor region.

20. An integrated structure protection circuit according to claim 5, characterized in that said semiconductor material having said first conductivity is an epitaxial layer grown on a semiconductor substrate.

21. An integrated structure protection circuit according to claim characterized in that said substrate has said first conductivity.

22. An integrated structure protection circuit according to claim 20, characterized in that said substrate has said second conductivity.

* * * * *

UNITED STATES PATENT AND TRADEMARK OFFICE
CERTIFICATE OF CORRECTION

PATENT NO. : 5,652,455
DATED : July 29, 1997
INVENTOR(S) : Raffaele Zambrano

It is certified that error appears in the above-identified patent and that said Letters Patent is hereby corrected as shown below:

On the title page: Item [73]

denoting Assignee, please delete "Israel" and insert therefor --Italy--.

In column 7, claim 3, line 4, please delete "era" and insert therefor --of a--.

In column 8, claim 16, line 36, please delete "15" and insert therefor --5--.

In column 8, claim 21, line 58, following "claim", please insert --20--.

Signed and Sealed this

Sixth Day of January, 1998

Attest:

BRUCE LEHMAN

Attesting Officer

Commissioner of Patents and Trademarks